(12) United States Patent
Noga et al.

(10) Patent No.: US 10,036,769 B2
(45) Date of Patent: Jul. 31, 2018

(54) APPARATUS FOR EFFICIENT MEASUREMENT OF TONE FREQUENCY, AMPLITUDE, AND PHASE

(71) Applicant: THE UNITED STATES OF AMERICA AS REPRESENTED BY THE SECRETARY OF THE AIR FORCE, Washington, DC (US)

(72) Inventors: Andrew J. Noga, Rome, NY (US); Daniel L. Stevens, Marcy, NY (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 15/214,493

(22) Filed: Jul. 20, 2016

(65) Prior Publication Data

US 2016/0363616 A1    Dec. 15, 2016

Related U.S. Application Data

(63) Continuation-in-part of application No. 14/737,542, filed on Jun. 12, 2015.

(51) Int. Cl.
*G01R 23/16* (2006.01)
*G06F 17/14* (2006.01)

(52) U.S. Cl.
CPC .......... *G01R 23/16* (2013.01); *G06F 17/141* (2013.01)

(58) Field of Classification Search
CPC .............................. G01R 23/16; G06F 17/141
See application file for complete search history.

(56) References Cited

U.S. PATENT DOCUMENTS

| | | | | |
|---|---|---|---|---|
| 5,936,576 A * | 8/1999 | Shimura | ................ | G01R 23/16 342/192 |
| 6,078,281 A * | 6/2000 | Milkovich | ............ | G01S 7/2926 342/162 |
| 2003/0058970 A1* | 3/2003 | Hamre | ..................... | G01J 11/00 375/342 |
| 2012/0163441 A1* | 6/2012 | Lechner | ................. | G01R 23/20 375/227 |

* cited by examiner

*Primary Examiner* — Chuong D Ngo
(74) *Attorney, Agent, or Firm* — Joseph A. Mancini

(57) ABSTRACT

An apparatus for efficient, precise and accurate measurement of the frequency, amplitude, and phase of a single input tone frequency and/or multiple separable input tone frequencies. Tone separability can be achieved by proper selection of the parameter N, the sample length of the DFT/FFT. Application of the invention includes but is not limited to test and measurement, tone interference removal, and communications systems, where precise and accurate measurement of tonal parameters is needed.

6 Claims, 4 Drawing Sheets

APPARATUS FOR EFFICIENT MEASUREMENT OF TONE FREQUENCY, AMPLITUDE, AND PHASE

CROSS-REFERENCE TO RELATED APPLICATIONS

This application is a Continuation-In-Part to copending U.S. patent application Ser. No. 14/737,542 filed on Jun. 12, 2015 and claims the priority date thereof.

STATEMENT OF GOVERNMENT INTEREST

The invention described herein may be manufactured and used by or for the Government for governmental purposes without the payment of any royalty thereon.

BACKGROUND OF THE INVENTION

Prior art is represented by the Tell-known discrete Fourier transform (DFT) or its case-specific efficient implementation, the fast Fourier transform (FFT). Efficient single and multi-tone frequency measurement can be achieved using the prior art. However, even though such prior art is efficient and has desirable noise-reduction properties, direct frequency measurement accuracy is limited to $2\pi/N$ radians.

In response to this deficiency in the prior art, two recently disclosed inventions, the DFT/FFT-based jackknife-localized multi-tone frequency measurement (JKLMTM) apparatus filed on Jun. 12, 2015 as U.S. patent application Ser. No. 14/737,542 and the DFT/FFT-based $1^{st}$-order difference multi-tone frequency measurement apparatus (1ODMTM) filed on Jun. 10, 2015 as U.S. patent application Ser. No. 14/735,228, represent methods of precise and accurate single and multi-tone frequency measurement. It remains desirable yet to provide an apparatus that can measure the remaining parameters of tones, specific the amplitude and phase.

OBJECTS AND SUMMARY OF THE INVENTION

It is therefore an object of the present invention to provide an apparatus that improves the accuracy of tone frequency, amplitude and phase measurements.

It is a further object of the present invention to provide an apparatus that performs accurate tone frequency measurements without the introduction of bias and discretization.

It is still a further object of the present invention to provide an apparatus that achieves tone frequency measurement with greater than $2\pi/N$ radians accuracy.

It is still a further object of the present invention to provide an apparatus that achieves tone frequency, amplitude and phase measurement with low process complexity.

Briefly stated, the present invention achieves these and other objects through an apparatus for frequency measurement (JKLMTM) which provides precise and accurate measurement of a single input tone frequency and/or multiple separable input tone frequencies. Tone separability can be achieved by proper selection of the parameter N, the sample length of the DFT/FFT. Combined with the JKLMTM apparatus is atone amplitude and phase measurement (TAPM) apparatus which provides both initial and refined measurements of tone amplitude and phase.

According to an embodiment of the invention, an apparatus for tone frequency, amplitude and phase measurement comprises a signal conditioner having an input and an output; an analog-to-digital converter having an input and an output; a parser having an input and an output; a Fourier Transformer having an input and an output; a selector having an input and an output; a first processor having a signal input, an output, and a coefficient input, where an external analog signal to be measured is input into the input of the signal conditioner; the output of the signal conditioner is connected to the input of the analog-to-digital converter; the output of the analog-to-digital converter is connected to the input of the parser; the output of the parser is connected to the input of the Fourier Transformer; the output of the Fourier Transformer is connected to the input of the processor and to the input of the selector; and where the output of the selector is connected to the coefficient input of the processor; and a second processor having a tone frequency input, a data segment input, an amplitude output, and a phase output where the tone frequency input is connected to the output of the first processor; and the data segment input is connected to the output of the parser.

According to an additional embodiment of the invention, an apparatus for tone frequency, amplitude and phase measurement comprises a third processor, where the third processor further comprises a second plurality of cosine registers having a cosine weighting, a tone frequency input connected to the output of the first processor, a phase input connected to the phase output of the second processor, and an output; a second plurality of sine registers having a sine weighting, a tone frequency input connected to the output of said first processor, a phase input connected to the phase output of the second processor, and an output; a first summer with an input being connected to and summing all the outputs of all the cosine registers, and an output; a second summer with an input being connected to and summing all the outputs of all the sine registers, and an output; a first scalar having an input connected to the output of the first summer, an input connected to the amplitude output of the second processor, and an output; a second scalar having an input connected to the output of the second summer, an input connected to the amplitude output of the second processor, and an output; a third summer having an input connected to the output of the first scalar, an input connected to the in-phase output of the second processor, and an in-phase output; a fourth summer having an input connected to the output of the second scalar, an input connected to the quadrature phase output of the second processor, and a quadrature phase output; where the third and the fourth summer outputs are processed according to an algorithm so as to provide a refined amplitude measurement at the amplitude output; and where the third and the fourth summer outputs are processed according to an algorithm so as to provide a refined phase measurement at the phase output.

The above and objects, features and advantages of the present invention will become apparent from the following description read in conjunction with the accompanying drawings, in which like reference numerals designate the same elements.

DETAILED DESCRIPTION OF THE PREFERRED EMBODIMENT

Figure 1:
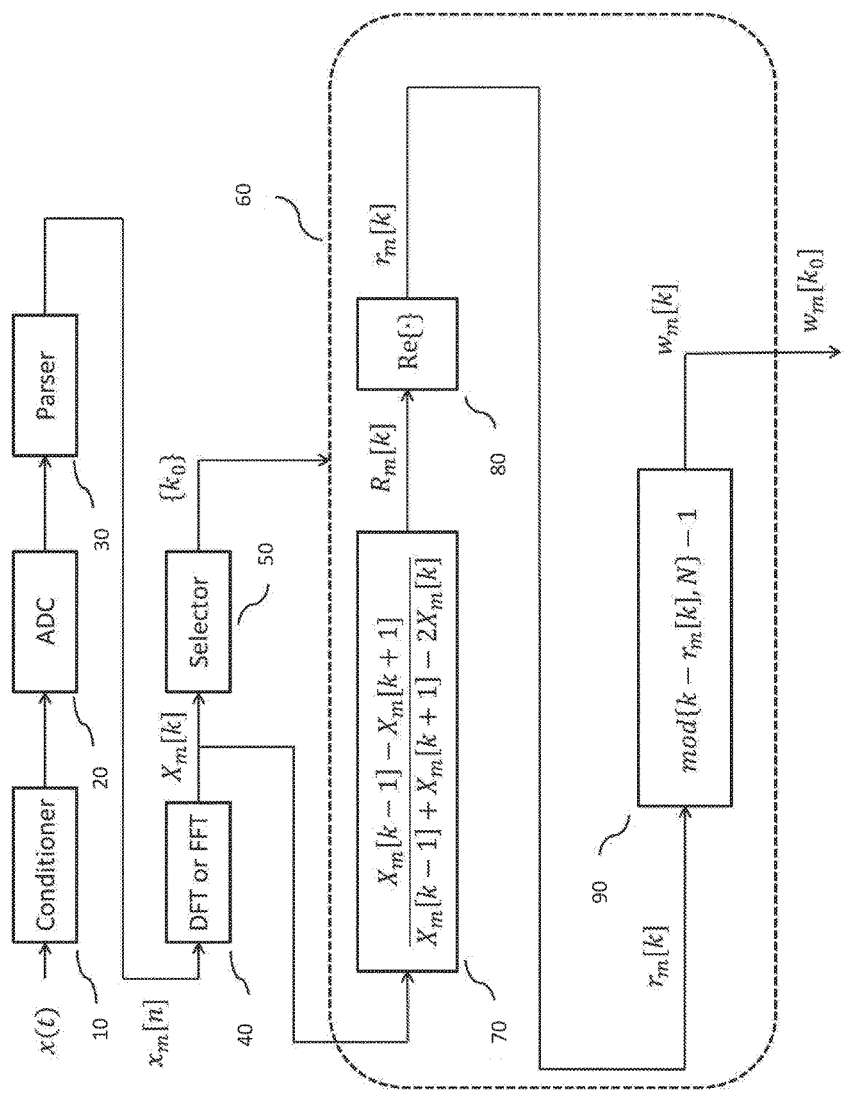
FIG. 1 depicts the invention in copending U.S. patent application Ser. No. 14/737,542, referred to hereinafter as a DFT/FFT-based jackknife-localized multi-tone frequency measurement (JKLMTM) apparatus.

Referring to FIG. 1, the invention disclosed in copending U.S. patent application Ser. No. 14/737,542 is a DFT/FFT-based jackknife-localized multi-tone frequency measurement (JKLMTM) apparatus which provides precise and accurate measurement of, a single input tone frequency and/or, multiple separable input tone frequencies. Here, tone separability can be achieved by proper selection of the parameter N, the sample length of the DFT/FFT. Practical application of the JKLMTM of the present invention includes but is not limited to is test and measurement, where precise and accurate measurements of tonal frequencies is needed.

Still referring to FIG. 1, the DFT/FFT-based jackknife-localized multi-tone frequency measurement (JKLMTM) apparatus is one of various methods of obtaining the precise and accurate measurement of the frequencies of tonal components contained in an input signal, x(t). The present invention incorporates this feature and accepts as input the $m^{th}$ segment of the sampled sign, $x_m[n]$, along with the frequency measurement, $w_m$, provided by JKLMTM depicted in FIG. 1.

The DFT/FFT-based jackknife-localized multi-tone frequency measurement (JKLMTM) apparatus is comprised of the components and sub-components as shown. Operation of the JKLMTM is as follows. An input signal, x(t), is conditioned by Conditioner 10, sampled by Analog-to-Digital-Converter (ADC) 20 to form the sequence x[n], and then parsed into length N segments by Parser 30. Here, n is an indexing variable corresponding to time, and is integer valued. Likewise, m is an integer-valued index resulting from the parsing of x[n], corresponding to the segment number.

The mth segment input to the device is designated as $x_m[n]$, and is processed by component 40 which performs an N-point Discrete Fourier Transform (DFT) or Fast Fourier Transform (FFT), $X_m[k]$. The integer index, is the $1 \le k \le N$, is the kth frequency bin along the discrete frequency independent variable. The output of component 40, $X_m[k]$, is input to both Selector 50 and sub-component 70 of component 60. Selector 50 identifies a set of frequency indices, $\{k_0\}$, for which frequency measurements are to be determined. Selector 50 can, for example, be implemented as a threshold and detect process, but is not limited to such a process.

Component 60 is a novel element in the apparatus and is now described in detail. For efficiency, the processing in component 60 is performed for the set of values $k=k_0$. Processing in component 60 proceeds as follows. Sub-component 70 determines the ratio, $R_m[k]=(X_m[k-1]-X_m[k+1])/(X_m[k-1]+X_m[k+1]-2X_m[k])$. This serves as input to sub-component 80, which determines $r_m[k]=\text{Re}\{R_m[k]\}$, the real part of $R_m[k]$. Completing the processing steps, sub-component 90 outputs the modulo difference, $w_m[k]=\text{mod}\{k-r_m[k],N\}-1$, for any k from 1 to N. This output can be scaled, depending on the desired unit of the frequency measurement. Index shifts designated as either k−1 or k+1 in component 60 are performed in a circular fashion to be consistent with the properties of discrete Fourier transforms.

While efficient single and multi-tone frequency measurement can be achieved using the prior art, and even though such prior a is efficient and has desirable noise-reduction properties, frequency measurement accuracy is limited to $2\pi/N$ radians. The JKLMTM leverages the noise-reduction properties of component 40 in achieving increased frequency measurement accuracy.

Figure 2:
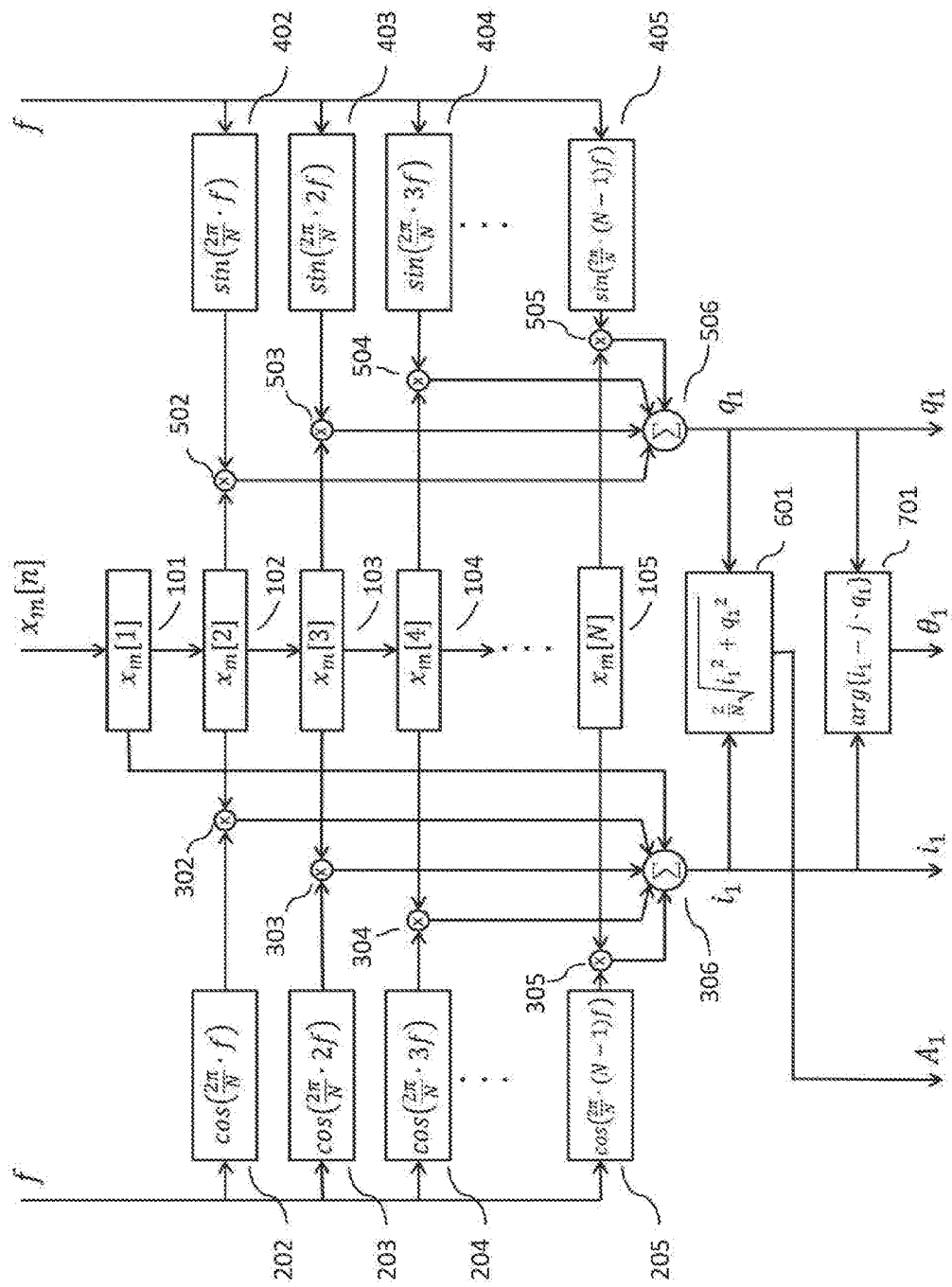
FIG. 2 depicts the Tone Amplitude and phase measurement apparatus first or initial processing step.

Referring to FIG. 2, the present invention measures the remaining parameters of these tones, being the amplitudes and phases. The combined set of parameters comprising frequency, amplitude and phase, provide external processes with the signal parameters needed to generate synchronous sinusoidal signals for applications such as carrier measurement in communications systems. The combined set of parameters is also needed in signal test and measurement equipment and various other electronic RF and audio systems.

Still referring to FIG. 2, operation of the tome, amplitude, phase measurement (TAPM) apparatus proceeds as follows. The first and required processing step operates on the input data segment sequences $x_m[n]$ and frequency measurements f from the pre-process shown in FIG. 1. As seen in FIG. 2, the signal data segment sequence, $x_m[n]$ is the signal data segment sequence from which the amplitude and phase parameters of selected tones will be measured. Each selected tone from the Selector process of FIG. 1, is independently processed for amplitude and phase measurements, either via parallel sets of the TAPM, or via sequential use of a single TAPM device. Without loss of generality, the phase and amplitude measurement of a single tone will be presented.

For any given tone, $k_o$, the frequency measurement, $f=w_m[k_o]$ (FIG. 1), is used along with the data segment sequence of the $m^{th}$ segment $x_m[n]$, to determine the initial measurements of amplitude and phase. For configurations where the pre-processing step is something other than or in addition to the JKLMTM, appropriate scaling of the frequency measurement is assumed. Also, for any general pre-processing step as in FIG. 1, signal amplitude conditioning is assumed to be factored into the measurement of tone amplitudes.

The input signal sequence is loaded into the value registers, 101 through 105. Cosine registers 202 through 205 are loaded with the cosine values as shown in the figure. Likewise, sine registers 402 through 405 are loaded with the sine values as shown. As implied, the frequency measurement, f, is a measurement of the frequency of the selected tone of interest in the signal segment.

Each value of the set of N values available from the input sequence is weighted, is according to the cosine and sine values loaded into the registers. These weightings are accomplished as shown in multipliers 302 through 305 and multipliers 502 through 505. A total of N cosine weightings and N sine weightings are used, with the first cosine weighting being a factor of 1 and the first sine weighting being a factor of 0. These weightings of 1 and 0 do not explicitly require multipliers, as reflected in the figure. All cosine-weighted values of the input signal segment are summed in summer 306. All sine-weighted values of the input signal segment are summed in summer 506. The output of summer 306 is the in-phase value of the first step. The output of summer 506 is the quadrature value of the first step, $q_1$. The in-phase and quadrature values can then be processed as in components 601 and 701 to create the initial measurements of amplitude and phase, $A_1$ and $\theta_1$ respectively.

Figure 3:
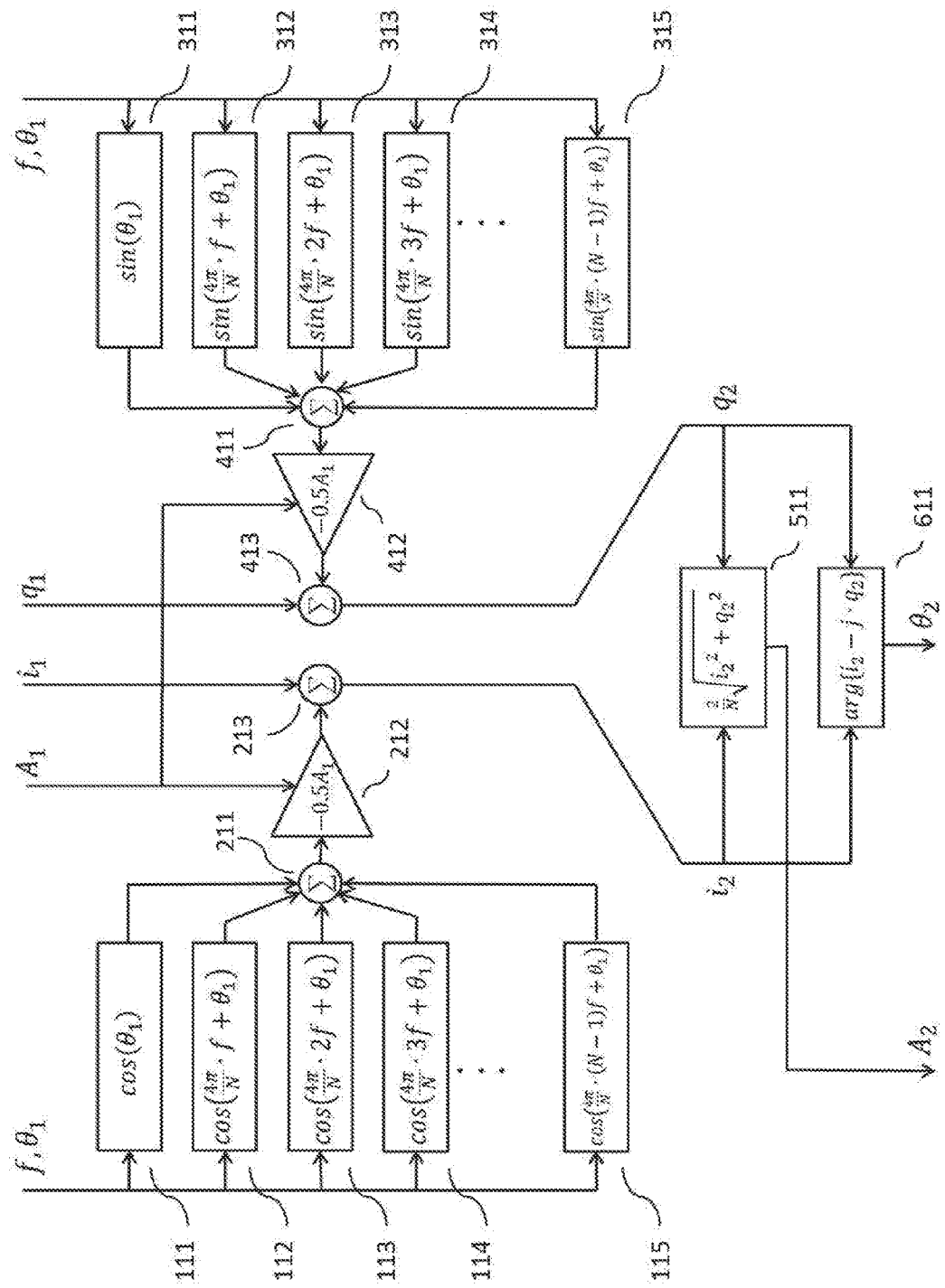
FIG. 3 depicts the Tone Amplitude and phase measurement apparatus additional embodiment having an optional second processing refinement step.
Figure 4:
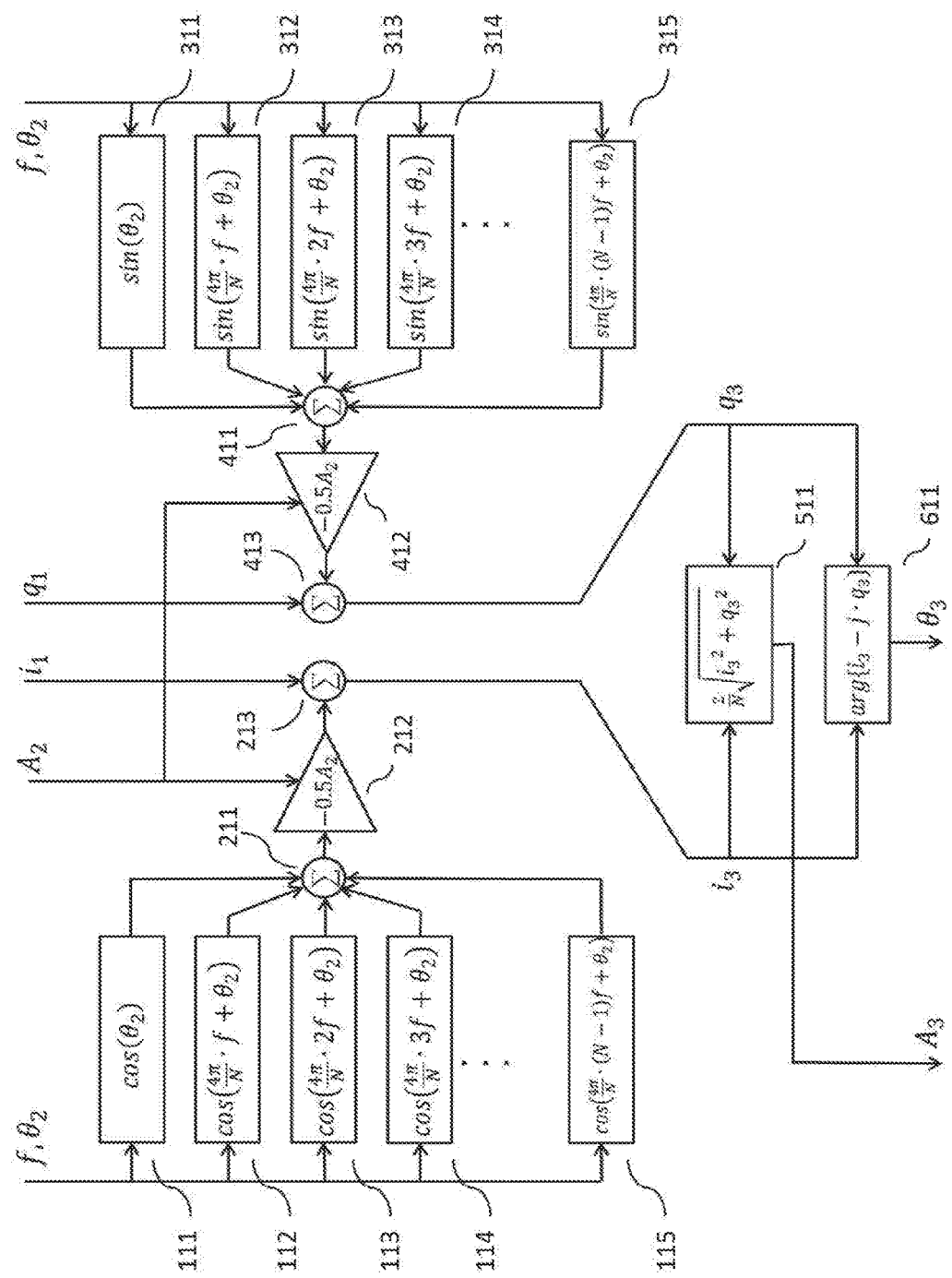
FIG. 4 depicts the Tone Amplitude and phase measurement apparatus additional embodiment having an optional third processing refinement step.

Depending on the requirements of a given application of the TAPM device, further refinement of the measurements of amplitude and phase may be required to achieve a higher desired accuracy and precision. Refinement of amplitude and phase measurements can be accomplished in one or more optional processing steps as shown in FIG. 3 and FIG. 4. These optional processing steps accept as input the amplitude and phase measurements from the most recent step. For example, as seen in FIG. 3, a second optional processing step would use amplitude and phase measurements $A_1$ and $\theta_1$. A third optional processing step would use amplitude and phase measurements $A_2$ and $\theta_2$. Each optional processing step operates on the initial in-phase and quadrature values, $i_1$ and $q_1$.

Referring to FIG. 3, the TAPM apparatus can optionally include a second processing step as shown. This processing operates on the in-phase and quadrature values from the initial processing step. Cosine register components 111 through 115 output the N cosine values as seen in the figure. These cosine values are summed together in summer 211. The output of summer 211 is scaled in amplitude by the factor −0.5 A in scaler 212. In this first refinement step, the value of A is $A=A_1$, the amplitude measurement obtained from the initial processing step. The output of scaler 212 is added in summer 213 with the input in-phase value, to obtain the refined in-phase value, $i_2$. Sine register components 311 through 315 output the N sine values as seen in the figure. These sine values are summed together in summer 411. The output of summer 411 is scaled in amplitude by the factor −0.5 A in scaler 412. In this first refinement step, the value of A is $A=A_1$, the amplitude measurement obtained from the initial processing step. The output of scaler 412 is added in summer 413 with the input quadrature value, to obtain the refined in-phase value, $q_2$. The refined in-phase and quadrature values are used by components 511 and 611, to determine the refined amplitude and phase measurements, $A_2$ and $\theta_2$.

Referring to FIG. 4, the TAPM apparatus could include additional processing steps for further refinement of amplitude and phase measurements. A third optional processing step would use amplitude and phase measurements $A_2$ and $\theta_2$. Each optional to processing step operates on the initial in-phase and quadrature values, $i_1$ and $q_1$. Experimental results indicate that most refinement occurs in the first optional refinement step.

The TAPM apparatus allows for a trade-off between implementation complexity and the fidelity of the amplitude and phase measurements. The processing step shown in FIG. 2 is the minimum of steps required to generate the amplitude and phase measurements. Optional TAPM processing steps as shown in FIG. 3 and FIG. 4 remove biases in the in-phase and quadrature values used to determine the amplitude and phase measurements, thereby increasing accuracy and precision.

Advantages and New Features

The TAPM apparatus leverages the super-resolution frequency measurements of devices such as the DFT/FFT-based jackknife-localized multi-tone frequency measurement (JKLMTM) apparatus or the DFT/FFT-based $1^{st}$-order difference multi-tone frequency measurement apparatus (1ODMTM), to achieve precise and accurate measurement of the remaining tone parameters, the amplitudes and the phases. Optional second and subsequent processing steps which are included in the TAPM apparatus, further refine the measurement of the amplitude and phase tone parameters.

Alternatives to the Present Invention

Various modes of the invention can include software implementation, firmware implementation, hardware implementation and/or hybrid (software/firmware/hardware) to implementations. Variations also include specific methods of accomplishing the components and sub-components such as using look-up-tables, Field Programmable Gate Arrays (FPGAs), trigonometric identities, combining components or sub-components into mathematical equivalents, etc.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. An apparatus for efficient tone frequency, amplitude and phase measurement, comprising:

a signal conditioner having an input and an output;

an analog-to-digital converter having an input and an output;

a parser having an input and an output;

a Fourier Transformer having an input and an output;

a selector having an input and an output;

a first processor having a signal input, an output, and a coefficient input, wherein, an external analog signal to be measured x(t) is input into said input of said signal conditioner and conditioned therein;

the conditioned signal output of said signal conditioner is connected to the input of said analog-to-digital converter whereupon it is sampled;

the sampled signal output of said analog-to-digital converter is connected to the input of said parser, wherein said parser parses the digital output of said analog-to-digital converter x[n] into m data segments of length N, wherein the $m^{th}$ said segment is represented as $x_m[n]$;

the $x_m[n]$ data segments output of said parser are connected to the input of said Fourier Transformer, wherein said Fourier Transformer performs an N-point Discrete Fourier Transform on $x_m[n]$, resulting in $X_m[k]$, wherein k is the $k^{th}$ frequency bin along a discrete frequency independent variable, and $X_m[k]$ is the Discrete Fourier Transform of any said data segment;

the $X_m[k]$ output of said Fourier Transformer is connected to the input of said first processor and to the input of said selector; and wherein the output of said selector is connected to the coefficient input of said first processor, wherein said selector selects a set of frequency indices for which frequency measurements are to be performed; and wherein said first processor performs a first step of processing a ratio $R_m[k]$ represented by $$R_m[k]=(X_m[k-1]-X_m[k+1])/(X_m[k-1]+X_m[k+1]-2X_m[k])$$

performs a second step of processing $r_m[k]$ represented by $$r_m[k]=Re\{R_m[k]\}; \text{ and}$$

performs a third step of processing a frequency measurement $w_m[k]$ represented by $$w_m[k]=\text{mod }\{k-r_m[k],N\}-1;$$

a second processor having a tone frequency input, a data segment input an amplitude output, and a phase output; wherein said tone frequency input is connected to the output of said first processor; and said data segment input is connected to said output of said parser;

wherein said second processor further comprises:
  a plurality of value registers having an input and an output, said input being connected to said data segment input into which each of said data segment sequences are sequentially input;
  a first plurality of cosine registers having a cosine weighting, a tone frequency input connected to said output of said first processor, and an output;
  a first plurality of sine registers having a sine weighting, a tone frequency input connected to said output of said first processor, and an output;
  a first plurality of multipliers each having an input connected to the output of a corresponding cosine register and to the output of a corresponding value register commencing with a second said value register, for cosine weighting a corresponding data segment;
  a second plurality of multipliers each having an input connected to the output of a corresponding sine register and to the output of a corresponding value register commencing with a second said value register, for sine weighting a corresponding data segment;
  a first summer having an in-phase output and having as inputs the outputs of all said first plurality of multipliers and the output of a first said plurality of value registers, for summing said cosine weighted data segments;
  a second summer having a quadrature phase output and having as inputs the outputs of all said second plurality of multipliers, for summing said sine weighted data segments;
  wherein said first and said second summer outputs are processed according to $$2/N\sqrt{(i_1^2+q_1^2)}$$

so as to provide an initial amplitude measurement at said amplitude output; and wherein said first and said second summer outputs are processed according to $$arg\{i_1-j^*q_1\}$$

$i_1$ is an initial in-phase component of phase measurement;

$q_1$ is an initial quadrature phase component of phase measurement;

N is the length of said data segments; and j is $\sqrt{-1}$ so as to provide an initial phase measurement at said phase output.

2. The apparatus of claim 1, wherein said Fourier Transformer performs a Fast Fourier Transform on $x_m[n]$, resulting in $X_m[k]$, wherein k is the $k^{th}$ frequency bin along a discrete frequency independent variable, and $X_m[k]$ is the Fast Fourier Transform of any said data segment.

3. The apparatus of claim 1, wherein said selector performs a threshold and detect function.

4. The apparatus of claim 1, further comprising a third processor, wherein said third processor further comprises
  a second plurality of cosine registers each having a cosine weighting, a tone frequency input connected to said output of said first processor, a phase input connected to said phase output of said second processor, and an output which produces a cosine weighted value corresponding to said input tone and input phase;
  a second plurality of sine registers each having a sine weighting, a tone frequency input connected to said output of said first processor, a phase input connected to said phase output of said second processor, and an output which produces a sine weighted value corresponding to said input tone and input phase;
  a first summer with an input being connected to and summing all said outputs of all said cosine registers, and an output;
  a second summer with an input being connected to and summing all said outputs of all said sine registers, and an output;
  a first scalar having an input connected to the output of said first summer for scaling the output of said first summer, an input connected to said amplitude output of said second processor, and an output;
  a second scalar having an input connected to the output of said second summer for scaling the output of said second summer, an input connected to said amplitude output of said second processor, and an output;
  a third summer having an input connected to said output of said first scalar; an input connected to said in-phase output of said second processor for summing said scaled output of said first scalar and said in-phase output of said second processor, and an in-phase output;
  a fourth summer having an input connected to said output of said second scalar, an input connected to said quadrature phase output of said second processor for summing said scaled output of said second scalar and said quadrature-phase output of said second processor, and a quadrature phase output;
  wherein said third and said fourth summer outputs are processed according to $$\frac{2}{N}\sqrt{(i_2^2+q_2^2)}$$

so as to provide a refined amplitude measurement at said amplitude output; and wherein said third and said fourth summer outputs are processed according to $$arg\{i_2-j^*q_2\}$$

where $i_2$ is a refined in-phase component of phase measurement;

$q_2$ is a refined quadrature phase component of phase measurement;

N is the length of said data segments;

j is $\sqrt{-1}$ so as to provide a refined phase measurement at said phase output; and wherein said apparatus comprises electronic hardware, electronic firmware, and software in any combination.

5. The apparatus of claim 4, wherein said apparatus comprises electronic hardware.

6. The apparatus of claim 4, wherein said apparatus comprises electronic firmware.

* * * * *